(12) United States Patent
Yoshida

(10) Patent No.: US 8,076,952 B2
(45) Date of Patent: Dec. 13, 2011

(54) SOCKET FOR INSPECTION

(75) Inventor: Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 372 days.

(21) Appl. No.: 12/375,263

(22) PCT Filed: Jul. 27, 2007

(86) PCT No.: PCT/JP2007/064792
§ 371 (c)(1),
(2), (4) Date: Jan. 27, 2009

(87) PCT Pub. No.: WO2008/013273
PCT Pub. Date: Jan. 31, 2008

(65) Prior Publication Data
US 2009/0230983 A1   Sep. 17, 2009

(30) Foreign Application Priority Data

Jul. 27, 2006 (JP) .................................. 2006-204437

(51) Int. Cl.
*G01R 31/00* (2006.01)

(52) U.S. Cl. ................................................. 324/756.02
(58) Field of Classification Search ............ 324/762.02–762.06, 756.01–756.07; 439/71, 160, 153, 439/491
See application file for complete search history.

(56) References Cited

U.S. PATENT DOCUMENTS

| 6,535,002 B2 * | 3/2003 | Haseyama et al. ....... 324/756.02 |
| 6,958,616 B1 * | 10/2005 | Mahoney et al. ........ 324/755.05 |
| 2004/0095157 A1 | 5/2004 | Sato et al. |

FOREIGN PATENT DOCUMENTS

| JP | 5-20286 U | 3/1993 |
| JP | 2004-14470 | 1/2004 |
| JP | 2004-014470 | 1/2004 |
| JP | 2004-170182 | 6/2004 |

OTHER PUBLICATIONS

Office Action issued by the Japanese Patent Office dated Apr. 22, 2011 in a counterpart foreign application.

* cited by examiner

*Primary Examiner* — Jermele M Hollington
*Assistant Examiner* — Tung X Nguyen
(74) *Attorney, Agent, or Firm* — Morgan, Lewis & Bockius LLP

(57) ABSTRACT

A support block is provided with a plurality of through holes for supporting probes. The probes for signals, for power supply and for grounding are secured in the through holes of the support block and electrically interconnect electrode terminals of a device to be inspected, which is provided on one face side of the support block, and wiring terminals connected to an inspection unit, which is provided on the other face side of the support block. A device guide is integrally formed with or separately fixed to the one face side of the support block, and includes an opening having a square shape in a plan view for guiding the device to be inspected. A centering mechanism adjusts a position of the device to be inspected at a center position of the opening of the device guide.

5 Claims, 6 Drawing Sheets

SOCKET FOR INSPECTION

TECHNICAL FIELD

The present invention relates to a socket for inspection for interconnecting electrode terminals (lead terminals) of a device to be inspected and wiring terminals to be connected to an inspection unit for the purpose of inspecting electrical performance of the device to be inspected such as an IC, before the device is actually assembled into a circuit. More particularly, the invention relates to the socket for inspection which can inspect the electrical performance by reliably bringing the electrode terminals of the device to be inspected into contact with probes of the socket for inspection, without causing defective contact between them, even though an interval between the adjacent electrode terminals becomes narrow due to such tendency that the electrode terminals are arranged at a narrow pitch.

BACKGROUND ART

Inspection for inspecting performance of a device (an object to be inspected) such as a semiconductor wafer, an IC or a module, by inputting an electric signal to the device, has been generally conducted. In case of conducting such inspection of electrical performance of the device, there has been employed a socket for inspection such as an IC socket which is provided with probes for interconnecting wiring terminals on a wiring board on which ends of leads to be connected to an inspection unit are collected and electrode terminals (lead terminals) of the device. In this socket for inspection, as shown in FIG. 6, for example, through holes are formed in a support block 92 for supporting probes 91 which is formed of resin or metal, then, the probes 91 for signals, for power supply, and for grounding are inserted into the through holes, and electrode terminals (lead terminals) 90a of a device 90 to be inspected which is provided on one face side of the socket are electrically connected to wiring terminals of a wiring board (not shown) which is provided on the other face side of the socket thereby to conduct the inspection. A device guide 94 formed with an opening 94a for positioning the device 90 to be inspected is provided on an outer peripheral part of this support block 92 at a side where the device 90 to be inspected is mounted, integrally with the support block 92 or formed as a separate component and fixed with screws or the like which are not shown (for example, refer to JP-A-2004-170182). In FIG. 6, reference numeral 93 designates a retaining plate for securing the probes 91 so as not to escape.

As describe above, the socket for inspection is provided with the device guide 94 having the opening 94a of a size to be conformed with a size of the device 90 to be inspected, in order to exactly position the electrode terminals 90a of the device 90 to be inspected with respect to the probes 91. The IC, for example, has an outer shape of a package formed of resin mold in many cases, and there is set a tolerance of ±0.1 mm, in a size of the outer shape of this package, with respect to the package having 30 mm square, for example. It is generally acceptable when the size of the package may be within this tolerance. However, even though the size is within this tolerance, there is a difference of 0.2 mm between the smallest package and the largest package. The opening 94a of the device guide 94 must be formed further larger, by about 0.05 mm, than the size of the largest package, because such a size that even the largest package can be smoothly received is required. For this reason, in case where the size of the package is the smallest within the tolerance, a width C of the package is smaller by 0.25 mm than a width D of the opening 94a, and a gap of 0.25 mm (D-C) is formed. As the results, there is such possibility that positional deviation of 0.125 mm may occur between a center of the device 90 to be inspected and a center point of the opening 94a of the device guide.

Actually, the electrode terminals (balls or lead terminals) of the device 90 to be inspected too are not always arranged in exact positions with respect to the center point of the package, but respectively deviated, and the probes 91 in the socket too are not always provided in exact positions with respect to the center point of the opening 94a. Therefore, when these deviations are superposed to the worse case, positional deviation may occur between the electrode terminals 90a of the device 90 to be inspected and the probes 91 of the socket for inspection. In some cases, the deviation more than 0.2 mm may occur between the electrode terminals 90a and the probes 91. Provided that a pitch of the electrode terminals is 0.5 mm, for example, when such deviation of 0.2 mm has occurred, there is a problem that tip ends of the probes 91 may be offset from respective centers of the electrode terminals 90a (FIG. 7A), or out of contact (FIGS. 7B and 7C), resulting in bad electrical conduction. In the drawings, there is shown an example in which a pitch p of the electrode terminals 90a is 0.5 mm, a ball of the electrode terminal (FIG. 7A) is φ0.3 mm, and a width of a pad of the electrode terminal 90a (FIGS. 7B and 7C) is 0.3 mm.

In order to solve the above described problem, there has been known such a structure that the device to be inspected, which is not shown, is always pressed with pushers 95 by means of springs 96 from two adjacent edges of the opening 94a having a square shape (a mounting part of the device to be inspected) so as to be urged toward one corner of the mounting part, as shown in a plan view in FIG. 8 showing an example of the socket for inspection. According to such structure, the probes of the sockets for inspection are provided by putting a baseline on the corner toward which the device to be inspected is urged, so that an amount of the deviation can be reduced to a half of the above described amount of the deviation, theoretically.

When intervals between the electrode terminals of the device to be inspected become narrow as described above, there is such a problem that reliable contact between the electrode terminals of the device to be inspected and the probes of the sockets for inspection is unable to be obtained in some cases, due to a gap between the opening in the socket for inspection in which the device to be inspected is disposed and the outer shape of the device to be inspected. This tendency leads to more serious problem, when the pitch of the electrode terminals becomes further smaller to less than 0.4 mm. In this case, the problem of defective contact between the electrode terminals and the probes of the socket for inspection cannot be completely solved, even in the method that the device to be inspected is pressed to the one corner of the socket for inspection, as shown in FIG. 8.

Further, in the structure as shown in FIG. 8, because the device to be inspected is always pressed to the one corner with the pushers 95 provided with the springs 96, there is a problem that the device to be inspected is rubbed and is likely to be electrified with static electricity. Moreover, when the device to be inspected is taken out after the inspection, the device to be inspected must be detached against a pressing force. However, in this case, it is difficult to take out the device to be inspected by vacuum suction which is generally employed. In addition, because the device guide (side wails of the opening 94 in FIG. 8) is scraped and an error in size may occur, there is such a problem that durability is deteriorated, and the device to be inspected is more likely to be electrified with the static electricity.

DISCLOSURE OF THE INVENTION

In view of the above, an object of the invention is to provide a socket for inspection in which a center point of a device to be inspected can be always aligned with a center point of an opening in a device guide of the socket for inspection, even though there are variety of sizes in outer shapes of the devices to be inspected.

The socket for inspection according to the invention includes: a support block, provided with a plurality of through holes for supporting probes; the probes for signals, for power supply and for grounding, secured in the through holes of the support block, and electrically interconnecting electrode terminals of a device to be inspected, which is provided on one face side of the support block, and wiring terminals connected to an inspection unit, which is provided on the other face side of the support block; a device guide, integrally formed with or separately fixed to the one face side of the support block, and including an opening having a square shape in a plan view for guiding the device to be inspected; and a centering mechanism for the device to be inspected, adjusting a position of the device to be inspected at a center position of the opening of the device guide.

Herein, the probe means a connecting pin which interconnects a wiring terminal on a wiring board and an electrode terminal (a lead terminal) of a device to be inspected, including both a contact probe of a type that a distal end of the connecting pin is movable and a pin having a fixed length but not movable. The contact probe means a probe which is so constructed that a distal end of a lead wire (a plunger) is movable and can be reliably kept in contact with the lead terminal or the like of the device to be inspected. This can be realized by such a structure that the lead wire is provided via a spring inside a metal pipe, for example, and one end of the plunger is projected from the metal pipe, while the other end is formed so as not to escape from the metal pipe, whereby the plunger is retracted into an end part of the metal pipe by pushing the one end of the plunger, and the plunger is projected from the metal pipe with a spring force by releasing an external force.

Specifically, the centering mechanism includes: support posts, which provisionally support the device to be inspected, and which can be moved up and down with a load; roller guides, provided at respective edges of the opening of the device guide in such a manner that at least parts of the roller guides are respectively exposed to the opening and the roller guides have rotation shafts which are substantially parallel to the edges; and pressing means for enabling the roller guides to move in a direction perpendicular to the edges. Therefore, the centering of the device to be inspected can be performed while the rotating rollers rotate, and hence, it is possible to prevent occurrence of abrasion by rubbing and generation of static electricity. The phrase "substantially parallel" means such a degree of parallelism that the centering can be conducted, even though the roller may get in touch with an edge of the device to be inspected.

The probes include contact probes in which tip ends of pins at least at a side opposed to the device to be inspected can be moved up and down by springs, and a height of the tip ends of the pins of the contact probes freely projected from a surface of the support block is $h_3$, a height of center positions of roller shafts of the roller guides from the surface of the support block is $h_2$, a height of top faces of the support posts from the support block in a state where no load is applied to the support posts is $h_1$, and the support posts, the roller guides and the probes are provided so as to satisfy the relation $h_1 > h_2 > h_3$. As the results, the centering can be completely performed, when the device to be inspected has come to the center position of the roller shafts of the roller guides, and the device to be inspected is brought into contact with the contact probes in a thus centered state thereby to be set on the socket for inspection instantly. Therefore, reliable contact between the electrode terminals of the device to be inspected and the probes can be obtained.

Further, position detecting means for detecting the position of the device to be inspected with respect to the opening are further provided, and the pressing means is provided with adjusting means which can adjust the center position of the device to be inspected detected by the position detecting means so as to correspond to the center position of the opening. Therefore, even though the forces of the pressing means which are respectively provided on the opposed edges are not completely equal in a state before the centering starts, the centering can be always conducted, by adjusting the pressing forces. in case where the pressing means which are respectively provided on the opposed edges are set to have the equal forces, in advance, and the device to be inspected can freely move, the centering can be automatically conducted, even though the position of the device to be inspected with respect to the opening in the device guide is not detected every time.

The roller guides are formed of antistatic material. Naturally, static electricity is unlikely to occur between the device to be inspected and the roller guides, since the friction scarcely occurs in the device to be inspected when contacted with the roller guides which are rotating. However, even though the static electricity has occurred, or the device to be inspected has been already electrified with the static electricity, moderate discharge of electricity which would not cause electrostatic destruction, but not abrupt discharge, can be immediately made because of the antistatic material. Herein, the antistatic material means the material formed of insulating material in which electrically conductive particles such as carbon particles are dispersed and having a surface resistance of $10^6$ to $11^{11} \Omega/cm^2$.

According to the socket for inspection of the invention, the centering mechanism for the device to be inspected is provided so that the center of the device to be inspected is positioned at the center of the opening in the device guide. Therefore, even though there is a gap between the opening in the device guide and the outer periphery of the device to be inspected, it is always possible to set the device to be inspected at the center of the opening. On the other hand, as the result of extensive researches by the inventor, it has been confirmed that displacement of the electrode terminals with respect to the center position of the device to be inspected is within a range of 0.15 mm in diameter (displacement of the center positions of the electrode terminals is 0.075 mm), and defective contact between the electrode terminals and the probes is eliminated, by aligning the center position of the device to be inspected with the center position of the opening in the device guide, even though a pitch of the electrode terminals is less than 0.4 mm.

Further, because the centering mechanism includes the support posts which support the device to be inspected provisionally, the roller guides provided at respective edges of the opening, and the pressing means for pressing the roller guides in a direction perpendicular to the edges, when the device to be inspected is mounted on the support posts and pushed down as it is, the device to be inspected is brought into contact with the roller guides, and positional adjustment is performed, while the roller guides rotate. In this case, in case where the pressing forces of the roller guides on the opposed two edges are equal, the centering can be automatically performed. On the other hand, in case where the pressing forces on the opposed edges are not equal, it is possible to detect the positional relation of the device to be inspected with respect to the opening, using the position detecting means such as a microscope, an image recognizing device, and to conduct the centering by minutely adjusting the positions of the roller guides, if there is any deviation. Then, by pushing down the device to be inspected in this state so as to be brought into contact with the surface of the support block, it is possible to set the device to be inspected on the support block by centering. As the results, the static electricity due to friction is unlikely to occur in the device to be inspected, and at the same time, abrasion of the socket for inspection can be restrained.

Further, the contact probes in which the tip ends of the pins (plungers) move up and down by means of the springs are employed as the probes, and provided that the heights of the tip ends of the pins in a state where the device to be inspected is not mounted, the height of the center positions of the roller shafts of the roller guides, and the highest position of the support posts from the support block in a state where no load is applied are respectively represented as $h_3$, $h_2$, and $h_1$, the support posts, the roller guides and the probes are provided so as to satisfy the relation $h_1 > h_2 > h_3$. In this case, the aforesaid adjustment of the centering can be conducted, before the device to be inspected comes into contact with the contact probes. At the same time, by removing the load for pressing the device to be inspected after the inspection has finished, the device to be inspected is naturally lifted up by the support posts, and can be picked up in a free state, without receiving the pressing force from the roller guides. Therefore, it is possible to very easily take out the device to be inspected. At the same time, reliability of the inspection is extremely enhanced by elimination of occurrence of the static electricity due to friction when the device to be inspected is detached, and damage of the socket for inspection due to abrasion.

BEST MODE FOR CARRYING OUT THE INVENTION

Now, the socket for inspection according to the invention will be described in detail referring to the attached drawings.

Figure 1A:
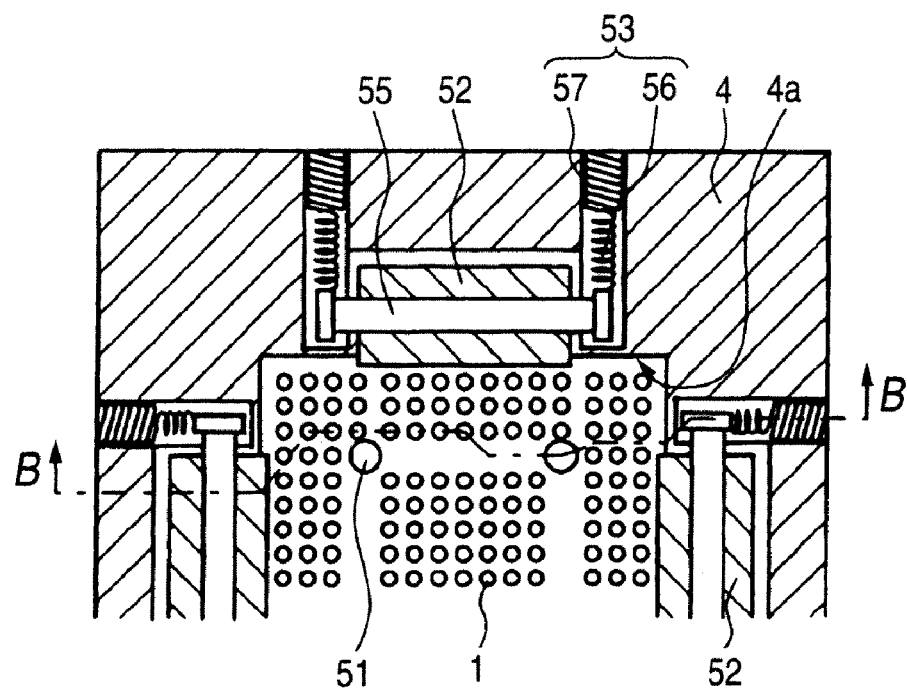
FIG. 1A is a cross sectional view showing a structure of a socket for inspection in an embodiment according to the invention.
Figure 1B:
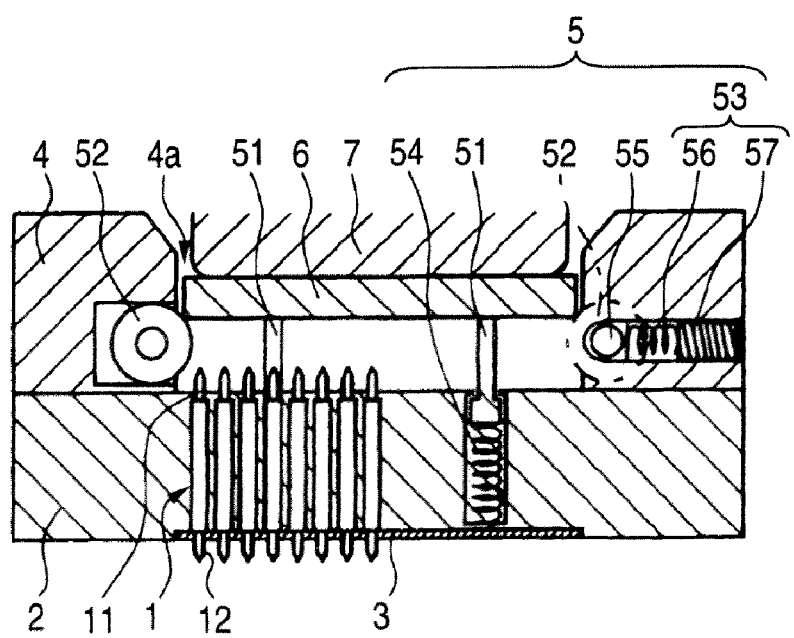
FIG. 1B is a vertical sectional view taken along a line B-B in FIG. 1A.

The socket for inspection in an embodiment according to the invention includes, as shown in FIGS. 1A and 1B, for example, a support block 2 in a plate-like shape which is provided with a plurality of through holes for supporting probes, probes 1 for signals, for power supply and for grounding which are provided in the through holes, and a device guide 4 including an opening 4a having a square shape in a plan view for guiding a device 6 to be inspected which are integrally formed with or separately fixed on one face side of the support block 2.

In this embodiment, a centering mechanism 5 for adjusting a center position of the device 6 to be inspected is provided at a center position of the opening 4a of the device guide 4.

The centering mechanism 5 includes support posts 51 which support the device 6 to be inspected provisionally and can be moved up and down with load, roller guides 52 having roller shafts 55 which are partially exposed to the opening 4a in the device guide 4 at respective edges of the opening 4a and are substantially in parallel with the edges, and pressing means 53 enabling the roller guides 52 to move in a direction perpendicular to the edges. Each of the roller guides 52 is so provided as to rotate around the roller shaft 55 in its center, and the roller shaft 55 is urged by the aforesaid pressing means 53, that is, a roller spring 56 in the embodiment as shown in FIG. 1, so that the roller guide 52 may be partially exposed to the opening 4a. An exposed amount of the roller guide into the opening 4a is set in such a manner that the roller guides 52 at both sides are brought into contact with the device 6 to be inspected with equal contact forces, even in case where the device 6 to be inspected has the smallest outer size within a tolerance. Moreover, a surface position of the roller guide 52 aligning with a side end of the opening 4a in the device guide 4 when the roller guide 52 protrudes most into the opening 4a is set to be at such a height that the height of the surface position from a surface A of the support block 2 is smaller than a height $h_1$ of the support post 51 by about $h_4$=0.1 mm (See FIG. 3).

The roller guide 52 is preferably formed of material such as rubber which is hard to slip, and more preferably formed of antistatic material, as described below, since the device 6 to be inspected can be prevented from being electrified. The antistatic material herein means the material formed of insulating material in which carbon particles are dispersed and having a surface resistance of $10^6$ to $11^{11} \Omega/cm^2$. In the embodiment as shown in FIG. 1, the pressing means 53 includes not only the roller spring 56 but also a spring adjusting screw (adjusting means) 57. This spring adjusting screw 57 is provided for the purpose of adjusting the forces of the roller springs 56 at both sides so as to be equal in case where they are not equal, and for adjusting the forces so that the device 6 to be inspected may be positioned at the center of the opening 4a, while the position is detected by position detecting means such as a microscope, an image recognizing device, etc. when the pressing forces cannot be adjusted to be equal in the centered state.

Figure 2:
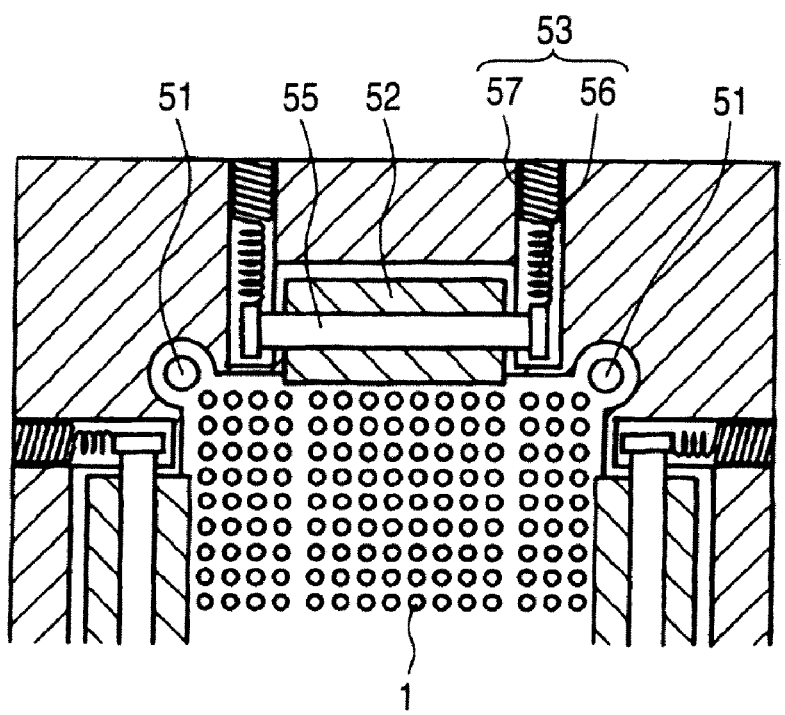
FIG. 2 is a cross sectional view showing a modification of the above described socket for inspection.

The support posts 51 are provided in four, for example, at positions where the probes are not provided, as shown in FIG. 1A, so that the device 6 to be inspected can be held inside the opening 4a. The support posts 51 are supported by support springs 54 in such a manner that the roller guides 52 are wide spread with a load which is applied to the device 6 to be inspected by a pushing member 7, and further, plungers 11 which are projected from the contact probes 1 are pushed down so as to reach the surface of the support block 2. These support posts 51 and the support springs 54 are provided on the support block 2, in those areas where the bristling probes 1 are not provided, in this embodiment. However, in case where there is no such space in the areas where the probes 1 bristle, it is also possible to provide them outside of a group of the probes 1, at positions corresponding to corners of the package of the device 6 to be inspected, as shown in FIG. 2. The number of the support posts need not be four, but may be three, provided that the device 6 to be inspected can be stably supported, or may be five or more by providing them both inside and outside of the group of the probes 1.

Figure 3:
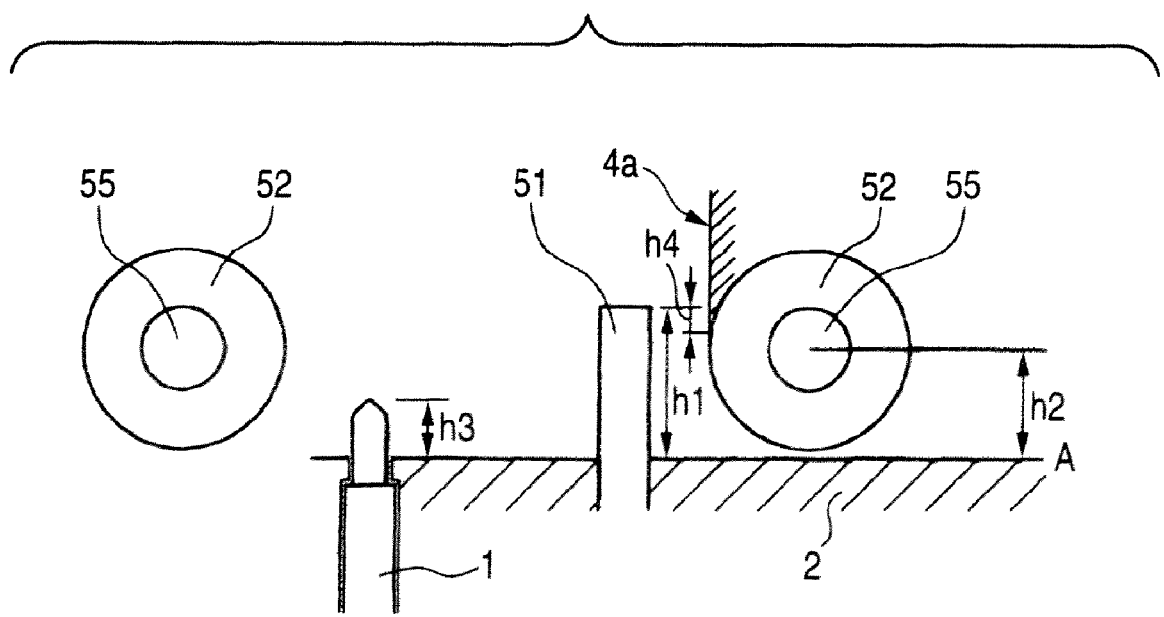
FIG. 3 is a view for explaining positional relation between respective parts of a centering mechanism in the above described socket for inspection.

The length of the support spring 54 and the support post 51 is set in such a manner that a height $h_1$ of the support post 51 projected from the surface A of the support block 2 in a state where no load is applied to the support post is higher than a height $h_2$ of a center position of the roller shaft 55 of the roller guide 52 from the surface A of the support block 2, and higher than a position where the roller guide 52 is exposed to the opening 4a by about 0.1 mm ($h_4$ in FIG. 3). However, the height $h_1$ is positioned within the opening 4a of the device guide 4. This height is set so that the device 6 to be inspected can be held so as not to come into contact with the roller guide 52, in a state where the device 6 to be inspected has been mounted on a top face of the support post 51. Moreover, the roller guide 52 and the roller shaft 55 are provided in such a manner that the height $h_2$ of the center position of the roller shaft 55 of the roller guide 52 is higher than he height $h_3$ of a projecting tip end of the plunger 11 of the contact probe 1, which will be described below. Reason for such relation between these heights and operation will be described below.

Figure 5:
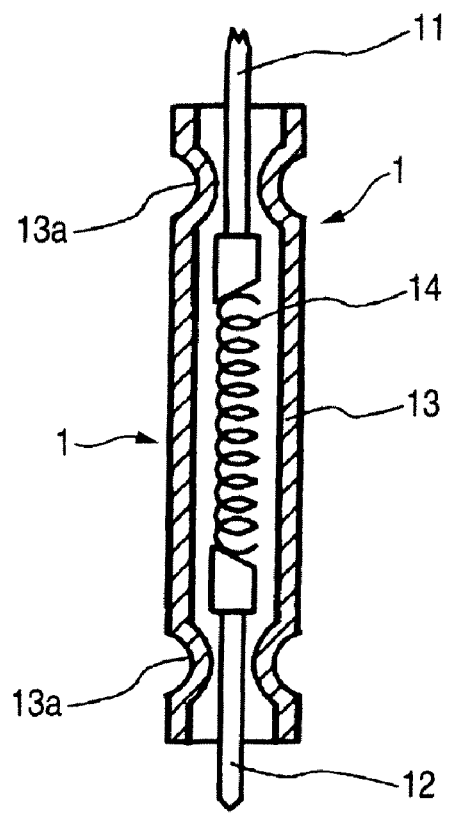
FIG. 5 is a vertical sectional view showing a structure of a contact probe as an example of a probe in the above described socket for inspection.

In this embodiment, the contact probe of the type that the plungers (lead wires) at its tip ends are provided so as to be movable by a spring, so that reliable contact with the device to be inspected and the wiring board can be obtained is employed, as the probe 1. However, the probe 1 is not necessarily limited to this type having a movable pin. The contact probe 1 as shown in FIG. 1 has such a structure that a spring 14 and one ends of plungers 11, 12 are contained in a metal pipe 13, and the plungers 11, 12 are retained so as not to escape from the metal pipe 13 by neck portions 13a, 13a which are formed in the metal pipe 13, and at the same time, urged outwardly by the spring 14, as shown, for example, in an explanatory sectional view in FIG. 5. In this structure, the spring 14 is contracted by pressing the tip ends of the plungers 11, 12, thereby to push the tip ends of the plungers 11, 12 into the metal pipe 13, and while no force is applied, the tip end of the plunger 11 is projected by about 1 mm, for example. Although the tip end of the plunger 11 has a pointed shape in this embodiment, the tip end may be split in four, as shown in FIG. 5, to obtain more reliable contact.

Moreover, although the plungers 11, 12 are provided at both ends of the contact probe in this embodiment, it would be sufficient that the plunger 11 is provided or at least one side of the contact probe to be brought into contact with the device to be inspected. For information, the metal pipe 13 has a length of about a few millimeters, and may be formed of nickel silver (an alloy of copper, nickel and zinc), for example. As the plungers 11, 12, linear material having a diameter of above 0.1 mm and formed of SK material or beryllium copper may be used. The spring 14 may be formed of a piano wire or the like. The contact probes 1 have substantially the same structure irrespective of their objects for use, namely, for signals, for power supply and for grounding. However, the probe for high frequency and high speed signals (high frequency in analogue form is referred to as the high frequency, while very short pulse width and short pulse interval in digital form are referred to as the high speed) maybe formed in a coaxial structure having this contact probe 1 as an inner conductor.

The support block 2 is intended to hold the probes 1, and may be formed of insulating material such as resin. In case where intervals between the electrode terminals of the device 6 to be inspected are narrow, and the device for the high frequency and high speed is inspected, it is necessary to form the probe for signals in a coaxial structure, and therefore, the metal block is employed, and the metal block is used as an external conductor, in some cases. In case of the insulating block, the resin such as polyether imide (PEI), polyimide (PI), polyether ketone (PEEK), polyamideimide (PAI) can be used, and in case of the metal block, aluminum or brass can be used. In both cases, the block is formed having a thickness of about 3 to 8 mm. Although the size of this support block 2 varies depending on the device to be inspected, the support block 2 is usually formed to have a size of 30 to 50 mm square.

In this embodiment, the contact probe 1 is supported by forming through holes having stepped portions and terminating at an end of the metal pipe 13 of the contact probe 1, through which the tip end of the plunger 11 is projected, on an upper side of the support block 2, and by providing a retaining plate 3 formed of an insulating sheet and formed with through holes through which the metal pipe 13 cannot pass, but only the plungers 12 can pass, on a lower end side of the contact probe 1. When the device 6 to be inspected has been set, the plunger 11 of the contact probe 1 is connected to the electrode terminals of the device 6 to be inspected while it is contracted to the surface of the support block 2, and the plunger 12 at the lower end side is disposed on the wiring terminal of the wiring board which is connected to an inspection unit which is not shown, whereby to plunger 12 is contracted to the lower end face of the support block 2 thereby to be connected to the wiring terminal.

The device guide 4 formed of insulating material such as resin or metal for guiding the device 6 to be inspected onto the contact probe 1 is provided on the surface of the support block 2. In this embodiment, the device guide 4 is formed separately from the support block 2, and fixed to the support block with screws or the like which are not shown. However, the device guide 4 may be formed integrally with the support block 2. In this device guide 4, the opening 4a for guiding the device 6 to be inspected is formed in a center part thereof, and as described above, the roller guides 52, the roller shafts 55, and the pressing means 53 (the roller springs 56 and the spring adjusting screws 57) which constitute the centering mechanism 5 are mounted thereon. The socket for inspection has substantially the same structure as the conventional socket for inspection of this type, except that this centering mechanism 5 is provided.

Figure 6:
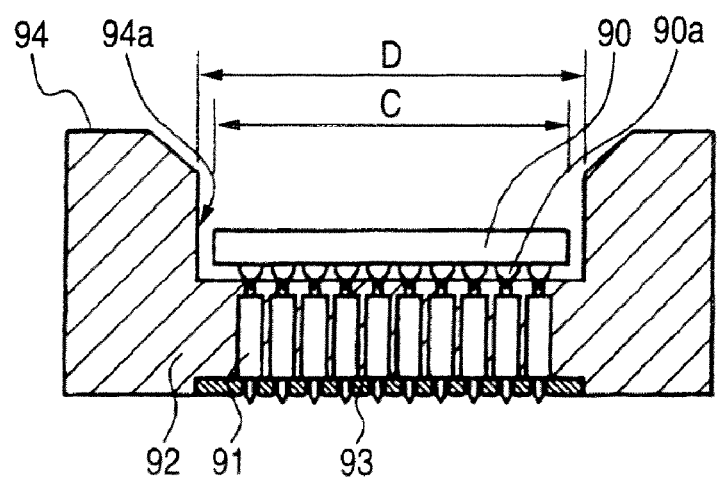
FIG. 6 is a vertical sectional view showing an example of a conventional socket for inspection.
Figure 7A:
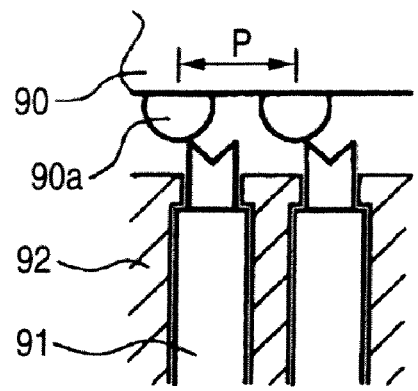
FIG. 7A is a view for explaining positional deviation between electrode terminals and probes in the conventional socket for inspection.
Figure 7B:
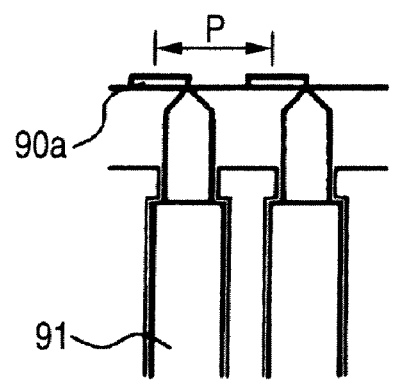
FIG. 7B is a view for explaining positional deviation between the electrode terminals and the probes in the conventional socket for inspection.
Figure 7C:
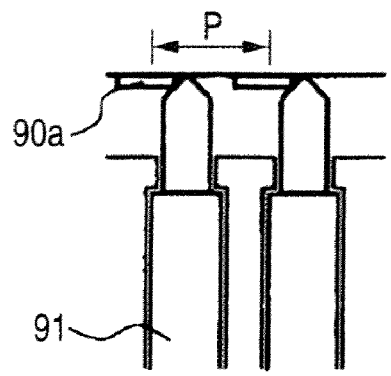
FIG. 7C is a view for explaining positional deviation between the electrode terminals and the probes in the conventional socket for inspection.
Figure 8:
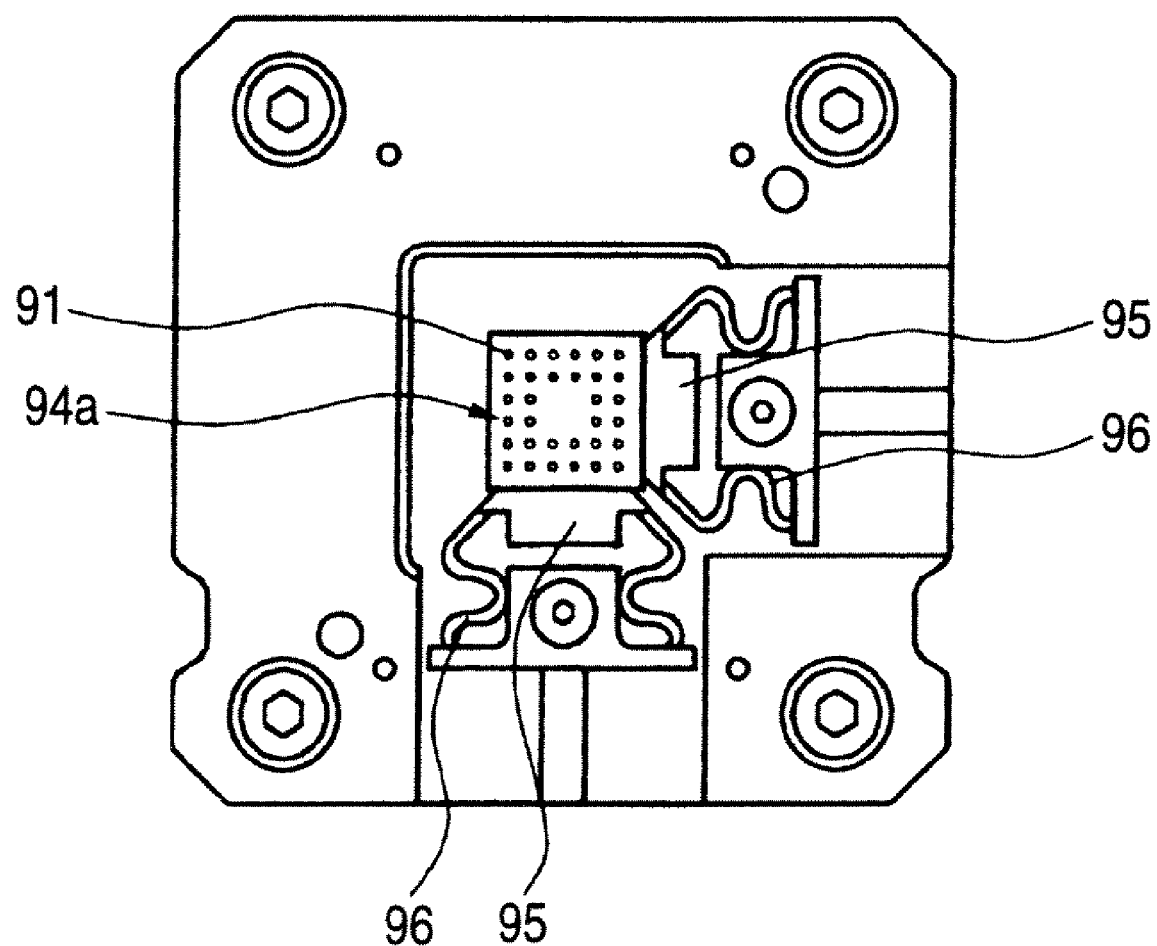
FIG. 8 is a plan view snowing another example of the conventional socket for inspection.

Then, a method of inspecting an IC or the like using this socket for inspection will be described. As a first step, the device 6 to be inspected is sucked by a vacuum chuck or the like and transferred to a position above the opening 4a in the device guide 4 of the socket for inspection. Then, the device 6 to be inspected is inserted into the opening 4a, and placed on the support posts 51. On this occasion, a width D of the opening 4a is slightly larger than a width C of the device 6 to be inspected, as shown in FIG. 6, and therefore, the device 6 to be inspected is roughly positioned with respect to the socket for inspection. Moreover, the height $h_1$ of the support posts 51 is so set as to be larger than the height of the part of the roller guide 52 projected into the opening 4a, by about 0.1 mm, as described above, and the device 6 to be inspected is placed on the support posts 51 without touching the roller guide 52. Accordingly, the height $h_1$ of the support posts 51 is naturally larger than the height $h_2$ of the center position of the roller shaft 55 of the roller guide 52.

Figure 4A:
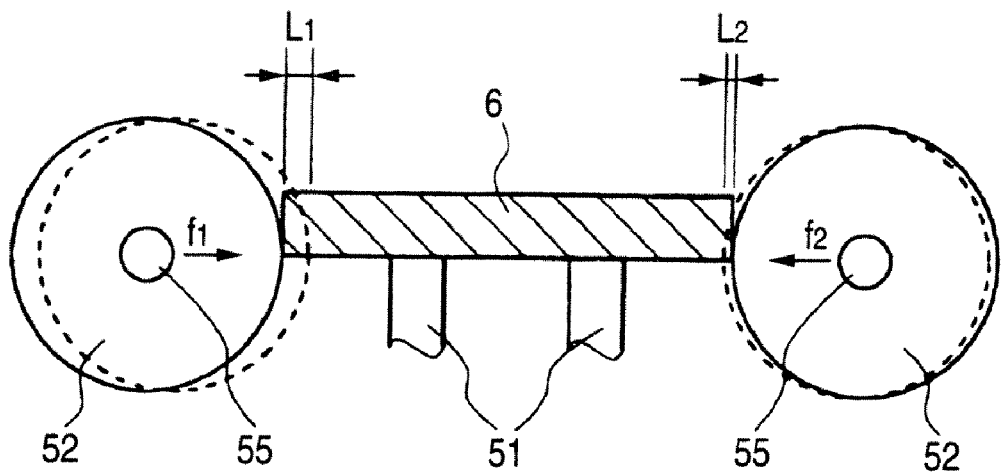
FIG. 4A is a view for explaining centering operation of a device to be inspected in the above described socket for inspection.
Figure 4B:
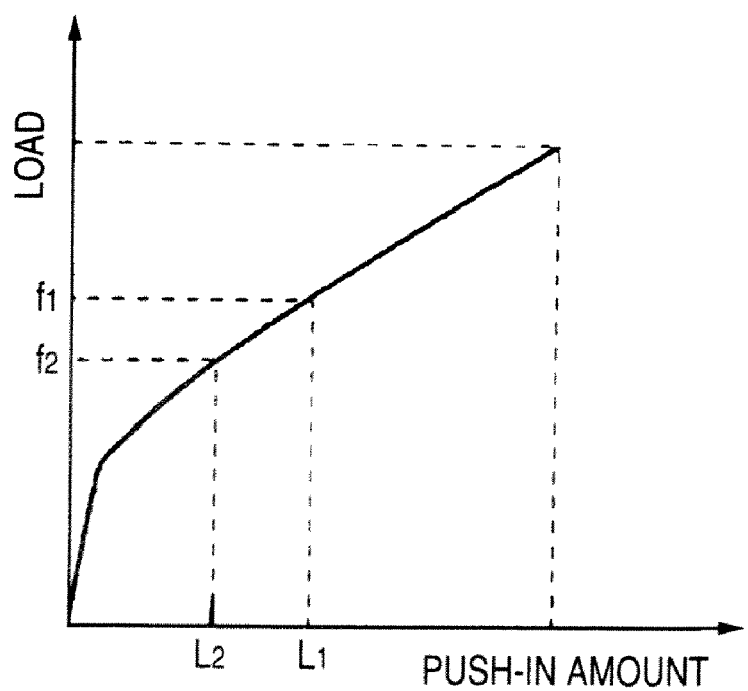
FIG. 4B is a view for explaining the centering operation of the device to be inspected in the above described socket for inspection.

By applying a load to the device 6 to be inspected by the pushing member 7, the device 6 to be inspected is lowered, since the support springs 54 which support the support posts 51 are contracted, and the device 6 to be inspected comes into contact with the roller guides 52 to push them away, whereby the device 6 to be inspected is further lowered up to the position of a centerline of the roller shafts 55. In a state where no pressure is applied to the roller shafts 55 by the pressing means 53, when the position of the device to be inspected is offset to the left side as shown in FIG. 4A, the roller guide 52 at the left side is pushed to the left by a larger amount $L_1$ from the initial position, while the roller guide 52 at the right side is pushed only by a smaller amount $L_2$. However, by setting the pressures so as to be equal at opposite sides (so that loads of the pressing means 53 at the opposite sides may be equal, when the device to be inspected having the largest size is inserted) with respect to the parts of the roller guides 52 which have entered into the opening 4a, before the device 6 to be inspected is pushed, the roller springs 56 at the opposite sides are formed to have the same performance. At the same time, provided that the device to be inspected can freely move, the one side which has been contracted more is pushed back to the other side which has been less contracted so that the loads at the opposite sides may become equal, and hence, centering of the device 6 to be inspected is automatically performed. Specifically, as shown in FIG. 4B, an amount of displacement (a push-in amount) varies substantially in proportion to the load of the pressing means 53, and in case where $L_1 > L_2$, it will be $f_1 > f_2$. Therefore, in order to make these forces equal, it will be $L_1 = L_2$.

On occasion of performing the centering in the above described method, the device 6 to be inspected cannot be automatically centered in some cases, because friction between the device 6 to be inspected and the pushing member 7 or the support posts 51 is too large. In such cases, the pushing member 7 may be slightly held back upward, at a time point when the device 6 to be inspected has reached the height $h_2$ by the pushing member, thereby to decrease the aforesaid friction force, and thus, it is possible to assist the automatic centering.

However, in case where the centering is not automatically performed, the amounts of displacement $L_1$, $L_2$ from the opposite ends of the opening 4a (the positions of the roller guides 52 as shown by dotted lines in FIG. 4A, before the device to be inspected is inserted), when the device 6 to be inspected has been pushed in up to the height $h_2$, may be respectively measured by position detecting means such as a microscope or an image recognizing device which are not shown. Then, the pressing means 53 at the side having the larger amount of displacement may be tightened with the adjusting screw 57 to apply a further load, whereby the amounts of displacement at the opposite sides are made equal, and thus, the centering can be performed. Although only the two roller guides at the right and left edges are shown in FIG. 4A, the other two roller guides at the edges in a direction perpendicular to the drawing are also positioned with respect to the opening 4a, and hence, the device 6 to be inspected can be accurately positioned at the center of the opening 4a in the device guide 4.

When the device 6 to be inspected is pushed by the pushing member 7 to push away the roller guides 52, the roller guides 52 are pushed down while rotating. Therefore, friction scarcely occurs between the device 6 to be inspected and the roller guides 52, and for this reason, static electricity is unlikely to occur. However, it would be preferable that these roller guides 52 are formed of antistatic material, because it is possible to more reliably prevent the device 6 to be inspected from being electrified, and at the same time, it is possible to discharge electricity without causing electrostatic destruction, even though the device 6 to be inspected has been already electrified with the static electricity before the inspection. Further, because the device 6 to be inspected and the roller guides 52 are in rotational contact and friction scarcely occurs, the centering mechanism in the socket for inspection will not be worn, and has an advantage of very high durability.

The device 6 to be inspected which has been centered by these roller guides 52 is further pushed down by the pushing member 7, and brought into contact with the tip end of the plunger 11 of the contact probe 1. Since the height $h_3$ of the tip end of the plunger 11 from the surface of the support block 2 is smaller than the height $h_2$ of the center position of the roller guide 52, as described above, the device 6 to be inspected comes into contact with the tip end of the plunger 11 after it has been centered. In this manner, it is desirable to perform the centering, before the device 6 comes into contact with the contact probe 1, and for this purpose, it is necessary to satisfy the relation $h_1 > h_2 > h_3$. By applying further load to the pushing member 7, the support spring 56 and the spring 14 of the contact probe 1 are contracted, whereby the device 6 to be inspected is pushed down to reach the surface of the support block 2 and set in the socket for inspection, making the center of the device 6 to be inspected aligned with the center of the opening 4a. Specifically, on occasion of this pushing down, there is no lateral movement, since no other load in the lateral direction than the roller guide 52 for conducting the centering is applied, and the device 6 to be inspected is pushed down directly below, thereby to be set without deviation of the centering. As the results, the contact probes 1 and the electrode terminals of the device 6 to be inspected are reliably contacted with each other for conducting the inspection.

After the inspection has finished, the load applied to the pushing member 7 is released. At the beginning, the device 6 to be inspected is moved upward with forces of the springs 14 of the contact probes 1 and the support springs 56 of the support posts 51, and when it has reached the position at the height $h_3$, the device 6 to be inspected moves upward up to the position where it has been initially placed on the support posts 51 (the position of $h_1$) by the forces of the support springs 56. During this upward movement too, the device 6 to be inspected and the roller guides 52 are in rotational contact and no frictional force is applied to the device 6 to be inspected, and hence, static electricity will not occur. Moreover, at this position, the device 6 to be inspected is not at all in contact with the roller guides 52, and hence, it is possible to detach and transfer the device 6 to be inspected without causing friction, even though the device 6 to be inspected is sucked by a vacuum chuck or the like.

In the above described embodiment, the centering mechanism 5 includes the support post 51, the roller guide 52 and the pressing means 53. Although it would be preferable to construct the centering mechanism in this manner, because the centering of the device to be inspected can be performed without friction, the centering mechanism is not necessarily limited to such structure. For example, it is possible to employ other structures such as the structure that the centering can be performed by moving the device to be inspected in a state held by the support posts in a lateral direction, while its position is detected.

INDUSTRIAL APPLICABILITY

As described above, according to the invention, it is possible to set the device to be inspected at the center of the opening in the socket for inspection in a very simple method. Therefore, even though intervals between electrode terminals become narrow due to high integration of the device to be inspected, interconnection between the probes of the socket for inspection and the device to be inspected can be reliably performed, and reliability of the inspection can be enhanced.

The invention claimed is:

1. A socket for inspection, comprising:
a support block, provided with a plurality of through holes for supporting probes; the probes for signals, for power supply and for grounding, secured in the through holes of the support block, and electrically interconnecting electrode terminals of a device to be inspected, which is provided on one face side of the support block, and wiring terminals connected to an inspection unit, which is provided on the other face side of the support block;
a device guide, integrally formed with or separately fixed to the one face side of the support block, and including an opening having a square shape in a plan view for guiding the device to be inspected;
a centering mechanism for the device to be inspected, adjusting a position of the device to be inspected at a center position of the opening of the device guide;
roller guides, provided at respective edges of the opening of the device guide in such a manner that at least parts of the roller guides are respectively exposed to the opening and the roller guides have rotation shafts which are substantially parallel to the edges; and
pressing means for enabling the roller guides to move in a direction perpendicular to the edges.

2. The socket for inspection as claimed in claim 1, wherein the centering mechanism includes:
support posts, which provisionally support the device to be inspected, and which can be moved up and down with a load.

3. The socket for inspection as claimed in claim 2, wherein the probes include contact probes in which tip ends of pins at least at a side opposed to the device to be inspected can be moved up and down by springs, and
a height of the tip ends of the pins of the contact probes freely projected from a surface of the support block is $h_3$, a height of center positions of roller shafts of the roller guides from the surface of the support block is $h_2$, a height of top faces of the support posts from the support block in a state where no load is applied to the support posts is $h_1$, and the support posts, the roller guides and the probes are provided so as to satisfy the relation $h_1 > h_2 > h_3$.

4. The socket for inspection as claimed in claim 2, further comprising position detecting means for detecting the position of the device to be inspected with respect to the opening, wherein the pressing means is provided with adjusting means which can adjust the position of the device to be inspected detected by the position detecting means so as to correspond to the center position of the opening.

5. The socket for inspection as claimed in claim 2, wherein the roller guides are formed of antistatic material.

* * * * *